United States Patent [19]

Kochsmeier

[11] 3,961,275

[45] June 1, 1976

[54] FM DISCRIMINATOR CIRCUIT

[75] Inventor: Hans-Hermann Kochsmeier, Hildesheim, Germany

[73] Assignee: Blaupunkt-Werke GmbH, Hildesheim, Germany

[22] Filed: May 21, 1975

[21] Appl. No.: 579,504

[30] Foreign Application Priority Data

June 5, 1974 Germany............................. 2427028

[52] U.S. Cl............................. 329/107; 307/221 C; 329/103
[51] Int. Cl.² ........................................... H03K 9/06
[58] Field of Search................... 307/221 C, 221 D; 329/103, 107, 145; 328/109, 133

[56] References Cited
UNITED STATES PATENTS
3,778,727   12/1973   Williams............................. 329/145

*Primary Examiner*—John Kominski
*Attorney, Agent, or Firm*—William R. Woodward

[57] ABSTRACT

A bucket brigade device (BBD) circuit is used to delay the output of the limiter in an FM receiver for use in a coincidence-type FM demodulator to which the undelayed limiter output is also supplied. The BBD circuit is stepped forward by a fixed frequency oscillator of a frequency conversion stage additional to the tunable converter of the receiver and the amount of delay is determined by a frequency division operation as well as the BBD length. The fixed frequency oscillator can be used also for automatic fine tuning and an arrangement for disabling the BBD stepping provides a good form of muting or blanking. The circuits are integrable in monolithic form.

6 Claims, 5 Drawing Figures

FM DISCRIMINATOR CIRCUIT

The present invention relates to a discriminator circuit stage, in which demodulation is obtained by means of a coincidence demodulator to which both a delayed and a nondelayed intermediate frequency (IF) signal are applied.

In FM broadcast receivers, discriminators are used to obtain the audio frequency (AF) information from an intermediate frequency signal.

For a long time, so-called ratio detectors have been used as FM demodulators. Lately, these ratio detectors have more and more frequently been replaced by coincidence detectors, since the latter can be manufactured by monolithic integrated circuit technology. Coincidence detectors have two inputs, to one of which a delayed FM signal is applied, the second one being supplied with the non-delayed FM signal.

Diverse delay elements have been used for the purpose of delaying the FM signal. An improvement with respect to the non-integrable LC networks, which were used at first, has been achieved by use of supersonic delay lines, whch are in fact likewise non-integrable, but are of dimensions which can be kept very small. The supersonic delay lines just mentioned, however, have the disadvantage that their delay-time is not adjustable and cannot be controlled by a control circuit. Therefore, the object of the present invention is to provide a discriminator stage which is completely integrable, and the delay-time of which is electronically controllable.

Subject Matter of the Present Invention

Briefly, the intermediate frequency is subjected to a second frequency conversion by means of an oscillator-mixer, and the delay is produced by a bucket brigade device (BBD) circuit controlled by a stepping signal which is obtained from the oscillator-mixer by means of frequency division.

An advantage of such discriminator stages consists in that for a given BBD the delay-time is exactly determined by the oscillator frequency of the second mixer stage.

A further advantage of a discriminator stage according to the present invention consists in that the BBD stepping control voltage, developed in the discriminator of the present invention, can easily be utilized for a fine-tuning (AFC) circuit without requirement of additional circuit elements.

In this case, since the delay-time is synchronized with both average intermediate frequency drift and oscillator frequency variations, the delay is always by the desired portion of the unmodulated-carrier period of the output signal of the second frequency conversion circuit.

The invention is further described by way of example with reference to the accompanying drawings in which.

Figure 1:
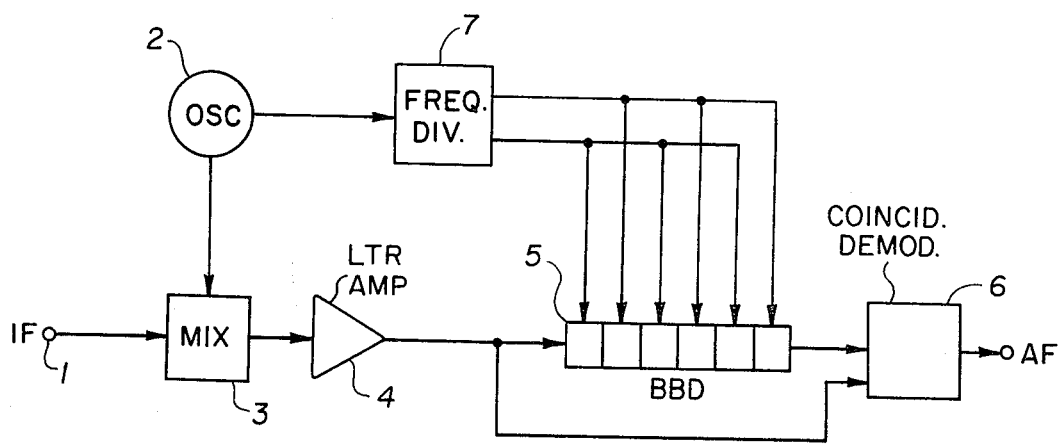
FIG. 1 shows a basic block diagram of a circuit according to the present invention.

At terminal 1 of the block diagram shown in FIG. 1, there is present the IF signal of a broadcast receiver that up to this point is of conventional design. The signal of an oscillator 2 is mixed with the IF signal in the mixer stage 3. The signal, thereby converted in frequency for the second time, is applied to a limiter amplifier 4, which shapes the IF waves into rectangular pulses. From there, the signal is fed to both a BBD circuit 5 and an input of a coincidence demodulator 6. The signal delayed by means of the BBD circuit 5 appears at the second input of the coincidence demodulator 6, at the output of which the audio frequency signal is present. The signal from the oscillator 2 is divided by a frequency divider 7, of which alternately pulsing outputs 7' and 7'' step the BBD circuit 5 ahead in synchronism with the oscillator 2. It is advantageous for the oscillator 2 to produce square waves.

The non-delayed signal together with the delayed signal are applied to the two inputs of a coincidence demodulator. The delay is preferably an odd multiple of $\pi/2$, in terms of radian measure, at the center output frequency of the mixer 3. The more cells there are in the BBD circuit the longer will be the delay, but since there is a practical limit to the stepping rate of a BBD, it is usually necessary to reduce the stepping rate by means of the frequency divider 7. If the BBD circuit 5 and the coincidence demodulator 6 are fed exclusively with square waves, the coefficient of harmonic distortion of the discriminator is theoretically 0, i.e. the shape of the discriminator characteristic, showing the conversion of the frequency variations into amplitude variations, is strictly linear.

The complete circuit can easily be provided in the form of a monolithic integrated circuit.

Figure 2:
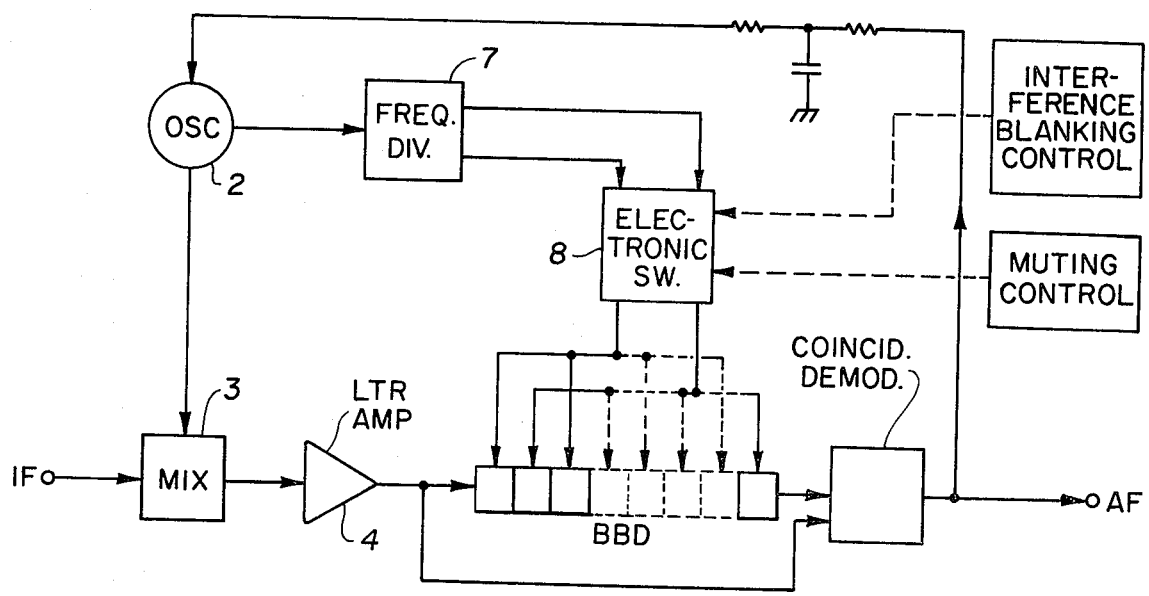
FIG. 2 shows a basic block diagram of a circuit according to the present invention together with a frequency control circuit and an electronic switch.

FIG. 2 represents the circuit already shown in FIG. 1 equipped with additional auxiliary circuits. A control voltage, developed in conventional manner in the coincidence demodulator 6, is directly used for tuning the mixer oscillator 2 finely by applying it to the frequency determining element of the mixer oscillator 2, e.g. a variable capacitance diode. Thus, the desired signal is permanently centered on the relatively linear portion of the demodulator characteristic. This operation is sometimes called AFC (automatic frequency control or automatic fine tuning). Tuning is thereby facilitated and an optimum suppression of interference due to amplitude modulated components of the desired signal is achieved.

In addition, there is shown an electronic switch 8 interconnected between the frequency divider 7 and the BBD circuit 5. To arrange switch 8 in this place is advantageous, as the signal path can be interrupted free of disturbances by switching off the stepping pulse source for the BBD circuit 5, i.e. without risk of producing audible noise by discharge of a capacitor. Control means for muting or interference blanking can be connected to the switch 8.

The discriminator principle according to the present invention thus evidently allows easy integration of additional means such as frequency control and a muting switch, and thus offers a simple easily realizable solution of problems that were heretofore unsolved.

Figure 3:
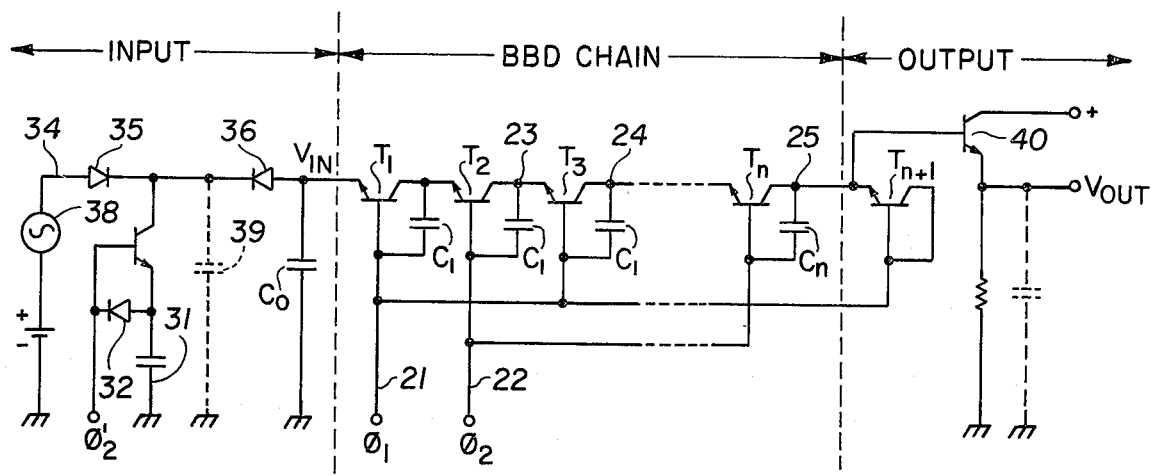
FIGS. 3 and 4 are circuit diagrams of bucket brigade device circuits.
Figure 5:
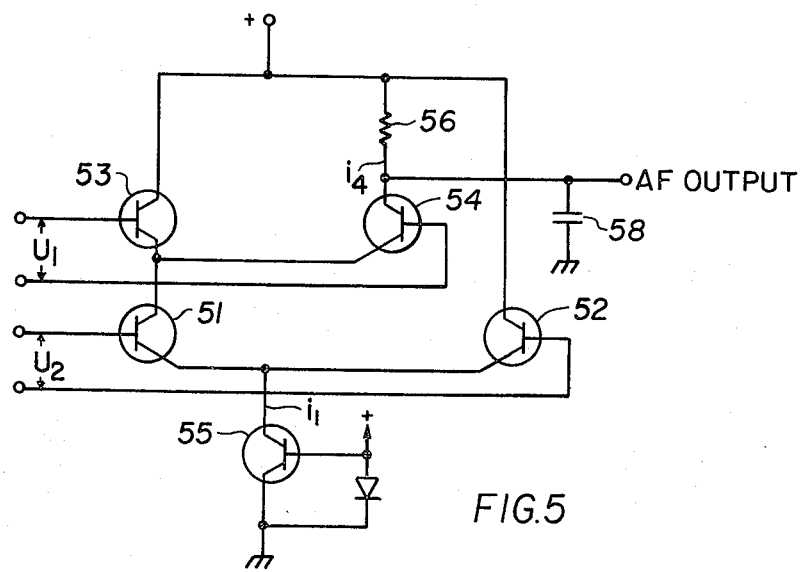
FIG. 5 is a circuit diagram of a coincidence demodulator.

FIG. 3 shows a bucket brigade device circuit of the bipolar type (i.e. it utilizes bipolar transistors), whereas FIG. 5 shows a BBD circuit of the MOS type (it uses metal oxide semiconductor field effect transistors, so-called MOSFETs). Operation of these circuits is fully explained in an article by A. Moeller in Internationale Elecktronische Rundschau, 1973, No. 11, pages 239 and 240, the essentials of which may be summarized as follows.

Consider first the BBD chain itself forming the central portion of FIG. 3. A square wave alternately turns on the odd numbered transistors $T_1$, $T_3$ . . . of the chain and the even numbered transistors $T_2$ . . . $T_n$ respectively through the stepping leads 21 and 22 respectively, the inputs of which are accordingly identified as $\pi_1$ and $\pi_2$. At any moment of time, each of the alternate capacitors of the sequence $C_1$, $C_2$ . . . $C_n$ connected between collector and base of the correspondingly numbered transistor is charged to a predetermined reference voltage, while each of the other capacitors of the chain has a charge corresponding to a sample of an analog signal. In the first half period of each stepping cycle, all of the information carrying capacitors take up charge from their output side neighbors until they reach the predetermined reference voltage and thereby transfer their information to the neighboring capacitor in the form of the charge there remaining after this operation. In the second half period of the cycle, the operation is repeated for all signal spaced one cell further from the input, so at the end of the stepping cycle each signal has taken over the position of the preceding information signal in the chain. The chain operates as an analog version of a shift register and this sort of device is used rather than a digital shift register in the circuit of the present invention, because the discriminator should be operable even when the incoming signal is not fully amplitude limited before it reaches the discriminator.

When capacitors $C_1$ and $C_3$ are charged to the full reference voltage, the potential at the connection points 23 and 25 briefly rises to twice that voltage, but the transistors $T_1$ and $T_3$ are simultaneously made conducting (base going positive) so that the information bearing capacitor $C_2$ receives charge from $C_3$. When the connection point 24 and hence also the emitter of $T_3$ reaches the reference potential, $T_3$ is blocked. In this moment the information is transferred from $C_2$ to $C_3$. In the meanwhile, $C_1$ has also received new information by transferring charge to the left, information which then in the second half cycle ($\phi_2$ at the reference voltage and $\phi_1$ at 0 volts) will be transferred on further to $C_2$.

At the left of FIG. 3 is an input circuit for the BBD chain. The stepping input $\phi'_2$ supplied to the base of transistor 30 is a mirror image (i.e. the inverse) of $\phi_1$ and it loads the buffer capacitor 31 periodically to a negative voltage of the same absolute magnitude as the positive reference voltage. In the next half cycle, it takes charge from the input capacitor $C_0$ while the transistor 30 conducts and the diode 32 is non-conducting. The charging current is interrupted as soon as $C_0$ has taken on the momentary potential of the signal source (the signal on the conductor 34 always being at some value between 0 and the positive reference voltage). In the next half cycle, $C_0$ passes its charge onto $C_1$ by drawing off charge from the latter. The diodes 35 and 36 prevent a direct flow of current between $C_0$ and the signal source 38. In order to charge the parasidic capacitance 39, the capacitor 31 must be sufficiently large.

The output of the BBD circuit is shown at the right of FIG. 3. The output signal is the voltage appearing on the last storage capacitor of the BBD chain $C_n$ which, because of the small loading capability of the capacitor $C_n$, is brought to the output of the circuit through the emitter follower transistor 40. $C_n$ is periodically recharged to the reference voltage by transistor $T_n+1$ which is connected as a diode, with its collector connected to its base. As explained in the Moeller article, the signal loss rising from the base current of the transistors can be calculated and compensated by an appropriately dimensioned regeneration circuit (not shown) by which the BBD chain at one or more places — according to the length of the chain — is relieved of the excess charge supplied by the transistor base electrodes by leaking this excess charge off to ground. As a practical matter, the capacitors are formed by providing oversize collector-base junctions to the transistors, rather than as separate components. The stepping frequencies for bipolar BBD circuits range from a few 10's of kHz to about 30 MHz and the delay period range between 1 microsecond and 1 milosecond, according to the Moeller article.

Figure 4:
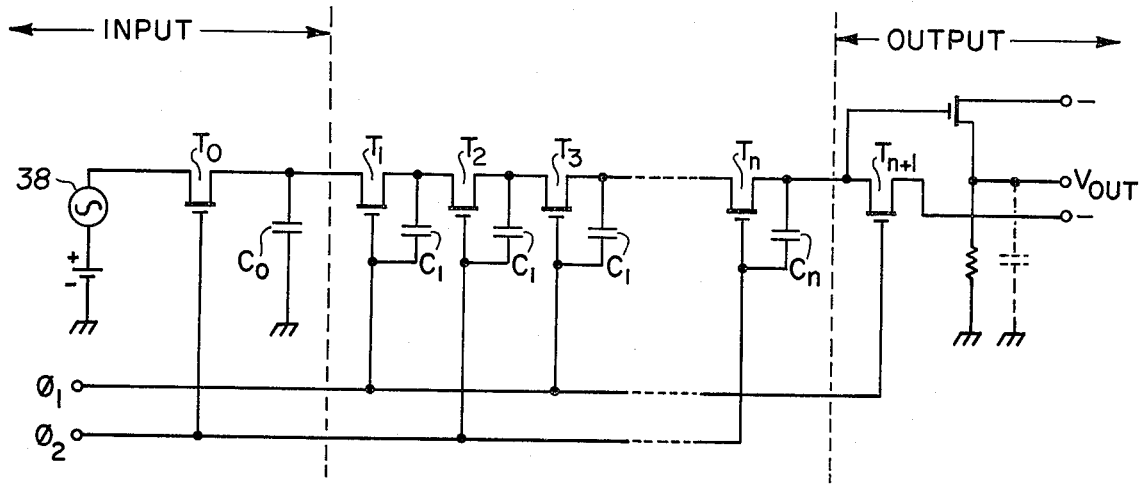

As can be seen from FIG. 4, the use of MOS technology to make a BBD results in a device somewhat easier to make, particularly with regard to the input, but the devices of this type are not capable of operation as rapidly as those of the bipolar type illustrated in FIG. 3. The active devices and capacitors, as well as the phase inputs of the stepping frequency, are identified with designations corresponding to those of FIG. 3, although in FIG. 4, of course, field effect transistors are involved, more particularly p-channel MOSFETs operated in the so-called enrichment mode, as the results of which the stepping voltages are negative. The buffer stage at the input is omitted, which shifts the moment of signal sampling with reference to the stepping phase. In this circuit, it is unnecessary to supply the additional stepping voltage $\phi'_2$. Furthermore, since practically no charge flows over the gate electrodes of the field effect transistors, the unshown regeneration circuit mentioned in connection with FIG. 3 can likewise be omitted. The MOS-BBD consists practically entirely of MOSFETs with oversize gate-drain capacities, cascaded in a chain. The channel length for this purpose can, for example, be 6 microns and the length of the gate-drain overlap 10 microns, while the gate-source overlap is kept as small as possible (for example by the use of silicon gate technology). By such construction, the chief cause for incompleteness of the charge transfer is almost entirely excluded. In both the bipolar and MOS kinds of BBD, the transistors interrupt the charge flow between the storage capacitors somewhat before the capacitors to be charged have reached the full stepping voltage, primarily on account of their threshold voltage, which in the case of a bipolar transistor is about 0.6 v. and in the case of a MOSFET about 1.5 to 3 v. This means only that the reference voltage is lowered slightly, which does not distort the signal. The Moeller article states that in the case of bipolar BBDs, stepping with sawtooth shaped voltages is more favorable than the more common rectangular waves, because the charge transfer then occurs with a smaller current that is practically constant during a large part of the charge transfer, whereas in the case of a square wave, the high initial current falls off rapidly and the charge transfer operation is thereby slowed up.

FIG. 5 is a circuit of a practical coincidence demodulator. In principle, a coincidence demodulator, somewhat like an AND gate, can be provided by a pair of transistors with their emitter-collector paths in series fed through a common load resistor, this combination conducting only during those periods during which both of the signals respectively fed to the bases of the transistors put the respective transistors into the conducting condition. In the circuit of FIG. 5, which is taken from FIG. 40 of Issue No. 14 for 1970 of Funkschau, page 469 and is designed for manufacture as a part of an integrated circuit (for example, the device then made by Sprague Electric Co. under the designation ULN2111), the two input voltages, that is, the delayed and undelayed signals at the last intermediate frequency, appear as shown by the voltages $U_1$ and $U_2$ at the left of FIG. 5. Each is applied to a differential amplifier, $U_1$ to the differential amplifier constituted by the transistors 51 and 52 and $U_2$ to the differential amplifier constituted by the transistor 53 and 54. Transistor 55 provides a stabilizing circuit that holds the sum of all emitter current constant. The load resistor 56 is in the circuit of the collector of transistor 54 and is affected by the conductivity of transistors 51 and 54. Thus, if for example the current through the transistor 54 and the load resistance 56 is to be increased, transistor 53 must be shut down, so that its current will be diverted to transistor 54. In order that an output voltage can appear across the load resistor 56, the currents $i_1$ and $i_4$ must flow. In order to drive a current $i_1$ through the transistor 51, its control voltage (base voltage) should be positive. In addition, if the voltage $U_2$ is to contribute the increase of the current $i_4$, it must make the base of transistor 53 negative to block it, so that transistor 54 receives more current. Since $U_2$ and $U_1$ must work with opposed polarity to produce additive effects, this corresponds merely to a phase reversal of one of the inputs, which is generally unimportant in FM detectors and can, in any event, be compensated for if it were necessary. The capacitor 58 filters out intermediate frequency components of the output from the desired audio frequency output.

The actual choices of frequency for the oscillator 2 for FIGS. 1 and 2 and the frequency division ratio of the circuit 7, as well as the length of the BBD chain, depend upon the intermediate frequency of the signal supplied to the mixer 3 and the band width of the demodulated signal, as can well be understood. In some cases, it may be possible to provide the stepping pulses to the BBD directly from the oscillator 2, although as mentioned above in most practical cases, it will be desirable to reduce this frequency in order not to exceed the maximum stepping rate of the BBD. In some cases, it may be necessary to divide the frequency by some number other than an integer, i.e. to obtain a divided frequency which is a fraction of the oscillator frequency which fraction has some other number than 1 in the numerator, which can be accomplished by providing frequency division and frequency multiplication in succession. Conceivably, the processing of the frequency of the oscillator 2 in order to provide the stepping pulses for the BBD 5 could be done by frequency addition or subtraction using a supplementary oscillator, but in practice that is likely to be expensive because of the necessity of maintaining the stability of all oscillator frequencies affecting the output.

For the usual case of an intermediate frequency of 10.7 MHz supplied to the mixer circuit 3, it is presently preferred to utilize a frequency of 10,22 MHz for oscillator 2 and a frequency stepped down ratio of 4 for the frequency divider circuit 7 and a BBD chain length of $n = 8$. Of course, these preferred values are a matter of choice of design and other values can be readily established for particular purposes in the light of the principles above set forth.

To provide a frequency control signal from the coincidence detector 6 to the oscillator 2, it is of course necessary to provide some additional filtering (not shown in the drawing), so that the low-frequency signal will not be fed back to the oscillator.

Although the frequency conversion provided by the oscillator 2 and the mixer 3 has been referred to as the "second" frequency conversion, it can actually precede the receiver tuning frequency conversion.

It may be desirable to introduce a separate stage between the dividing circuit 7 and the inputs of the BBD 5 to provide the necessary phase inputs, but normally, the frequency division circuit 7 itself would include the necessary elements for providing output pulses of the proper characteristics.

Although the invention has been described with reference to particular illustrative examples, therefore, it will be understood that variations are possible within the inventive concept.

I claim:

1. FM discriminator circuit in which demodulation is obtained by means of a coincidence demodulator to which both a delayed and a non-delayed intermediate frequency signal are applied, comprising:
    oscillator-mixer means (2,3) for subjecting the intermediate frequency signal to a frequency conversion additional to the frequency conversion used for tuning;
    bucket brigade circuit means (5) for producing a delayed signal from an intermediate frequency signal which has been subjected to frequency conversion by said oscillator-mixer means, said bucket brigade circuit means (5) being controlled by pulses of a stepping feqeuency;
    means, responsive to an output of the oscillator (2) of the oscillator-mixer means for providing said stepping frequency pulses to said bucket brigade circuit means, and
    coincidence demodulator means and means for supplying said coincidence demodulator means with both delayed and undelayed intermediate frequency signals which have been subjected to frequency conversion by said oscillator-mixer means, said delayed signal being provided from the output of said bucket brigade circuit means and said undelayed signal being provided from the source of the input of said bucket brigade circuit means.

2. Discriminator circuit according to claim 1 in which said means for providing stepping frequency pulses includes a frequency division circuit.

3. Discriminator circuit according to claim 1 in which said means for providing said stepping frequency pulses produces square waves.

4. Discriminator circuit according to claim 3 comprising also an electronic switch (8) interposed in said means for providing said stepping frequency pulses.

5. Discriminator circuit according to claim 4 in which means are provided for controlling said electronic switch (8) for interference blanking.

6. Discriminator circuit according to claim 4 in which means are provided for controlling said electronic switch (8) to produce muting.

* * * * *